(12) United States Patent
Yang et al.

(10) Patent No.: US 6,784,105 B1
(45) Date of Patent: Aug. 31, 2004

(54) SIMULTANEOUS NATIVE OXIDE REMOVAL AND METAL NEUTRAL DEPOSITION METHOD

(75) Inventors: Chih-Chao Yang, Beacon, NY (US); Yun Wang, Hopewell Junction, NY (US); Larry Clevenger, Hopewell Junction, NY (US); Andrew Simon, Fishkill, NY (US); Stephen Greco, Hopewell Junction, NY (US); Kaushik Chanda, Poughkeepsie, NY (US); Terry Spooner, Hopewell Junction, NY (US); Andy Cowley, Wappingers Falls, NY (US); Sunfei Fang, Hopewell Junction, NY (US)

(73) Assignees: Infineon Technologies North America Corp., San Jose, CA (US); International Business Machines Corporation, Armonk, NY (US); United Microelectronics Co. (TW)

( * ) Notice: Subject to any disclaimer, the term of this patent is extended or adjusted under 35 U.S.C. 154(b) by 0 days.

(21) Appl. No.: 10/410,496

(22) Filed: Apr. 9, 2003

(51) Int. Cl.$^7$ .............................................. H01L 21/44

(52) U.S. Cl. ............... 438/687; 438/637; 438/643; 438/653; 438/675; 438/685; 438/688

(58) Field of Search ................. 438/618, 637–640, 438/627–629, 648–650, 652–654, 656, 668, 672, 673, 675, 685, 687–688

(56) References Cited

U.S. PATENT DOCUMENTS 5,534,730 A * 7/1996 Mori et al. ................. 257/757
6,485,618 B2 * 11/2002 Gopalraja et al. ..... 204/192.17

* cited by examiner

Primary Examiner—Thanh Nguyen
(74) Attorney, Agent, or Firm—Lerner, David, Littenberg, Krumholz & Mentlik, LLP

(57) ABSTRACT

A method of fabricating a semiconductor device having a dielectric structure on which an interconnect structure is optionally patterned using lithographic and etching techniques, within a single deposition chamber, is provided. The dielectric structure may optionally be covered by diffusion barrier materials prior to a sputter etching process. This sputter etching process is used to remove the native oxide on an underneath metal conductor surface and includes a directional gaseous bombardment with simultaneous deposition of metal neutral. Diffusion barrier materials may also be deposited into the pattern.

16 Claims, 11 Drawing Sheets

200

200'

Prior Art Process

Prior art process

Prior art process

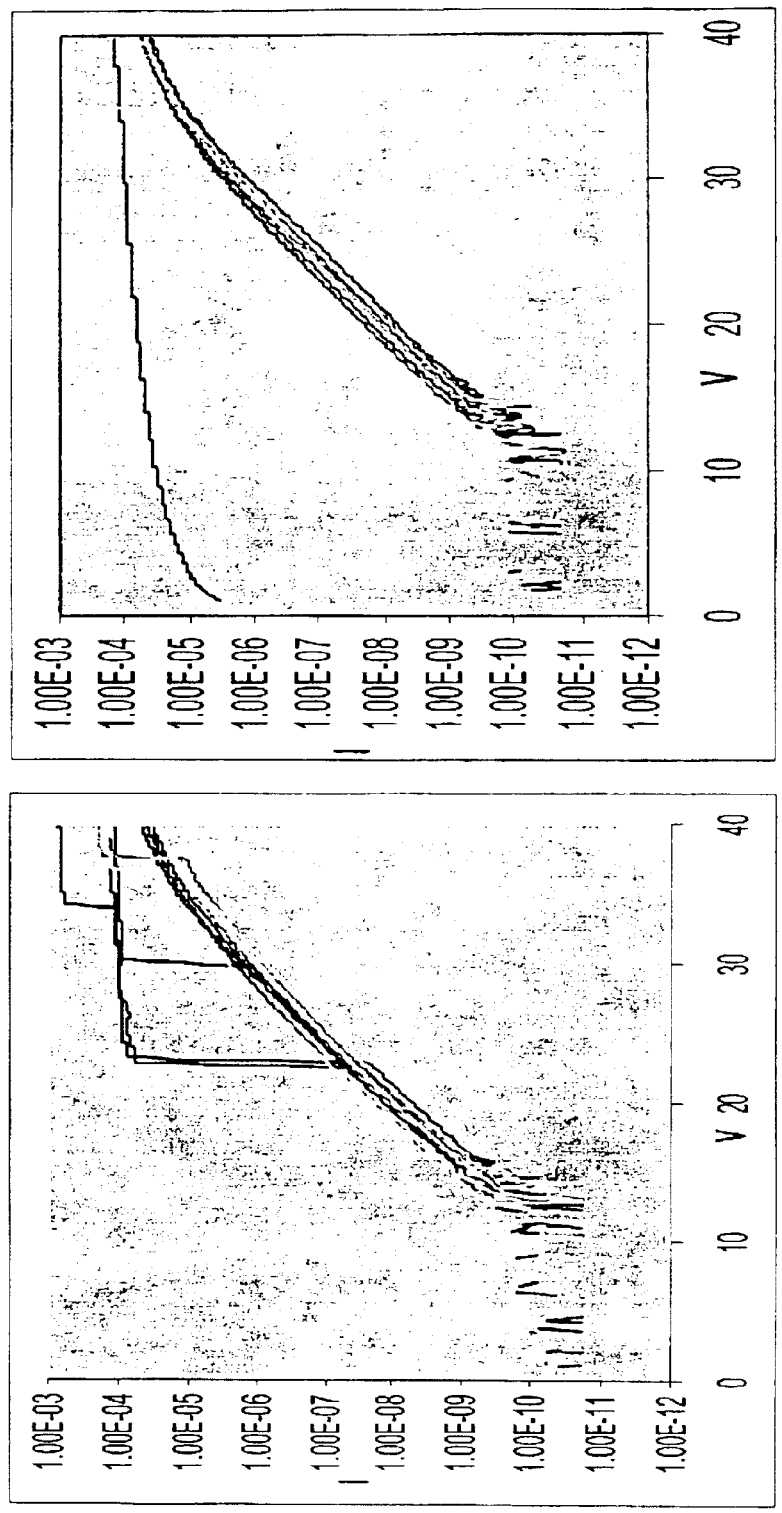
Fig. 8(a) Ramping Test- I-V Curves

TDDB Results

| process | prior process | present invention |
|---|---|---|
| Test Structure | Defmon Maze | Defmon Maze |
| Number of Structures | 24 | 24 |
| T0 Fails | 1 | 2 |
| Number of Structures at Stress | 23 | 22 |
| Total TDDB Fails | 7/23 | 1/22 |

Fig. 8(b)

SIMULTANEOUS NATIVE OXIDE REMOVAL AND METAL NEUTRAL DEPOSITION METHOD

FIELD OF THE INVENTION

The present invention relates generally to semiconductor chip fabrication.

BACKGROUND OF THE INVENTION

Increasing semiconductor chip density has placed more components on the wafer surface, which has, in turn, decreased the area available for surface wiring of the components. This has led to multilevel metallization schemes using a stack of multiple metal layers on the wafer. A typical stack starts with a barrier layer formed by silicidation of the silicon surface to produce a lowered electrical resistance between the surface and the metal layer.

Barrier layers also prevent alloying of aluminum and silicon if aluminum is the conducting material of the metal layer. Both titanium-tungsten (TiW) and titanium nitride (TiN), as well as other materials, are typically used to form a barrier layer.

Sometimes a first layer of platinum silicide is formed on the exposed silicon before the TiW is deposited. TiW is usually sputter-deposited onto the wafer into the open contacts before the conducting material deposition (i.e., aluminum) takes place. The TiW deposited on the field oxide is normally removed from the surface during the aluminum etch step.

Titanium nitride layers can be placed on the wafer by several deposition techniques, including evaporation, and sputtering. A layer of titanium is normally required under TiN films to provide a high conductivity intermediate with silicon substrates.

With copper (Cu) metallization, the barrier is also critical. Copper inside the silicon ruins device performance. Barrier metals frequently used include TiN, tantalum (Ta), and tantalum nitride (TaN).

A typical wafer has a layer of some dielectric material, called an intermetallic dielectric layer ("IDL"), that provides the electrical isolation between metal layers. This layer may receive a masking step that etches new-contact holes, called "vias" or "plugs", down to the first-level metal. Conducting plugs may also be created by depositing conducting material into the hole. The first-level metal layer is then deposited and patterned. The IDL/plug/metal deposition/patterning sequence is repeated for subsequent layers.

A multilevel metal system is more costly than a single level metal system. It is also of lower yield and requires greater attention to planarization of the wafer surface and intermediate layers to create good current-carrying leads. It is partly in accordance with this greater attention that processes have been developed to remove contaminating oxide buildup on the wafer ("native oxide").

Semiconductor wafer fabrication thus involves processes in which one or more layers are formed on a dielectric wafer, often after an interconnect structure has been patterned onto the dielectric (a "hard mask"). Typically, metal is deposited on the wafer and selectively etched away. Successive layers of metal and semiconductor or dielectric form electrical components on the semiconductor wafer.

Prior to metal deposition, the surface of the wafer may require cleaning of native oxide. Such cleaning is conventionally performed in a separate sputtering chamber from that used for metal deposition. Moving the wafer from one deposition chamber to another incurs an increased chance of contamination of the wafer from the ambient environment, as well as an increase of cost of fabrication, since at least two chambers are required.

Conventional directional argon bombardment ("Ar sputtering") is a common process used during deposition of metal barrier and seed layers on an interconnect structure. Ar sputtering processes are used for both metal deposition and as a "clean".

Sputter deposition is a process that (in general) can deposit any material on any substrate. It is widely used to coat costume jewelry and put optical coatings on glasses and lenses. Sputtering takes place in a vacuum, and is a physical, not a chemical process. It is sometimes also referred to as physical vapor deposition. The foregoing description of sputter deposition is a general description, and is not intended to exclude alternative theories of how the sputtering process operates or any particular sputtering apparatus.

Sputter deposition conventionally takes place inside a vacuum chamber ("deposition chamber"), in which a solid slab, called a "target", of the material desired to be deposited. The target is electrically grounded. Argon gas is introduced into the deposition chamber and is ionized to a positive charge. The positively charged Ar atoms (actually "ions") are attracted to the grounded target and accelerate towards it. During the acceleration they gain momentum, which is force, and strike the target. At the target, a phenomenon called momentum transfer occurs. Just as a cue ball transfers its energy to other balls on the pool table, causing them to scatter, the Ar ions strike the slab of deposition material, causing its particles to scatter. Thus, the Ar atoms 'knock off' atoms and molecules from the target into the vacuum of the deposition chamber. This is the sputtering activity. The sputtered atoms or molecules scatter in the deposition chamber with some coming to rest on the wafer.

Sputtering is a favored method of depositing material on a wafer in a stepwise fashion, where an even coating is desired. Material arrives at the wafer with a wide range of angles to coat the wafer surface. Such "step" coverage is further improved by rotating and heating the wafer.

Clean and dry argon (or neon) is required to maintain film (coating) composition characteristics, and low moisture is required to prevent unwanted oxidation of the deposited film. The deposition chamber is loaded with the wafers and the pressure is reduced by pumps (pumped down) to approximately $1 \times 10^{-9}$ torr. The Ar is introduced and ionized. Control of the Ar amount entering the chamber is critical due to its effect of raising the pressure in the chamber. With the Ar and sputtered material in the deposition chamber, the pressure is raised to approximately $1 \times 10^{-3}$ torr. Chamber pressure is a critical parameter in the deposition rate of the system. Thus, deposition chambers are precision equipment with associated high costs of purchase, operation and maintenance. Also, most conventional deposition chambers require careful and time-consuming setup and operations.

The intention of conventional Ar sputter clean is to remove the native oxide on the surface of the wafer to which metal will be deposited. The Ar sputter clean may, however be performed on patterned dielectric or metals layers. It was observed that the bombardment of an Ar sputter clean always results in some potential problems.

When conventional Ar sputter clean is performed on a patterned wafer, damage may occur to the wafer. In FIG. 2, a profile view schematic of a wafer, before 200 and after 200' conventional Ar sputter clean is presented. The wafer 200, 200' includes several features. It includes a hard mask 201, and IDL 202, and a metal 203. After conventional Ar sputter clean, the wafer 200' may have damage to the hard mask 201', or to the IDL 202'. Changes may also occur to the etching profile 204', as well as to the sidewalls 206'. Moreover, the underneath metal may be splashed onto and even penetrate the IDL 205'.

Damage may also occur to the wafer when conventional Ar sputter clean is performed on a metal layer. In FIG. 3(a) an exemplary profile schematic of a wafer, before (300) and after (300') performing conventional Ar sputter clean, is presented. The wafer 300, 300' includes a hard mask 301, and IDL 302, and a metal 303. After conventional Ar sputter clean, the wafer 300' may have deposited metal removed at the field 307', trench bottom 302' and tapered sidewall 306'. Damage to the hard mask 301' or to the IDL 302 may also occur, as well as changes to the etching profile 304'. Again, the underneath metal may be splashed onto the IDL and onto the deposited metal 305'.

SUMMARY OF THE INVENTION

A need exists for a process of semiconductor fabrication that minimizes the number of process chambers used by not requiring the use of more than one chamber for the metal deposition and sputter clean processes.

A need exists for a gaseous sputter clean process to be performed on a dielectric layer which avoids or minimizes damage to the hard mask, or to an IDL, and that does not significantly change the etching profile or splash underneath metal onto the IDL.

The present invention provides a method of fabricating a semiconductor device within a single deposition chamber, the semiconductor device being a dielectric structure on which an interconnect structure is optionally patterned using lithographic and etching techniques. Initial metal layer(s) may or may not be deposited on the patterned dielectric structure. Next, without moving the patterned wafer to a sputtering chamber, native oxide is removed by a directional gaseous bombardment, which comes simultaneously with a deposition of metal neutral.

The method further preferably includes deposition of one or more initial metal layers on the dielectric structure with a thickness in the range 10 Angstroms to 500 Angstroms.

In accordance with an embodiment, one or more further materials may be deposited on the dielectric structure. These materials may preferably include liner or seed layer materials, such as any one or more materials selected from the group comprising TaN, Ta, Ti, Ti(Si)N, W or Cu.

A need also exists for a gaseous sputter clean process to be performed on a metal layer which avoids or minimizes damage to the hard mask or to an IDL, that does not significantly change the etching profile, that minimizes removal of deposited metal at the field, trench bottom and tapered sidewall, does not splash the underneath metal onto the IDL and onto the deposited metal, and does not require that the semiconductor structure be moved to a process chamber different from that used for earlier fabrication steps.

The present invention advantageously provides a method of in situ deposition of a metal neutral for protecting the structure features during the directional gaseous bombardment for removing native oxide on a metal surface of a semiconductor device. Directional gaseous bombardment of the semiconductor device with simultaneous metal neutral deposition is preferably used.

In a preferred embodiment, the metal neutral may include the same material as the target or other materials selected from the group consisting of Ta, Ti or W.

BRIEF DESCRIPTION OF THE DRAWINGS

FIG. 8(a) are sample I–V test results depicting the performance of two exemplary wafers produced using prior art methodology (left) and the embodiment of the present invention (right) respectively; and FIG. 8(b) are sample TDDB test results depicting the performance of two exemplary wafers produced using prior art methodology (left) and the embodiment of the present invention (right) respectively.

DETAILED DESCRIPTION

In accordance with an embodiment of the present invention, a gaseous sputter clean process is provided to be performed on a patterned wafer which avoids or minimizes damage to the hard mask or to an IDL, and that does not significantly change the etching profile or splash the underneath metal onto the IDL.

Additionally, in accordance with an embodiment of the present invention a method of fabricating a semiconductor device advantageously using a single deposition chamber is provided.

Figure 1:
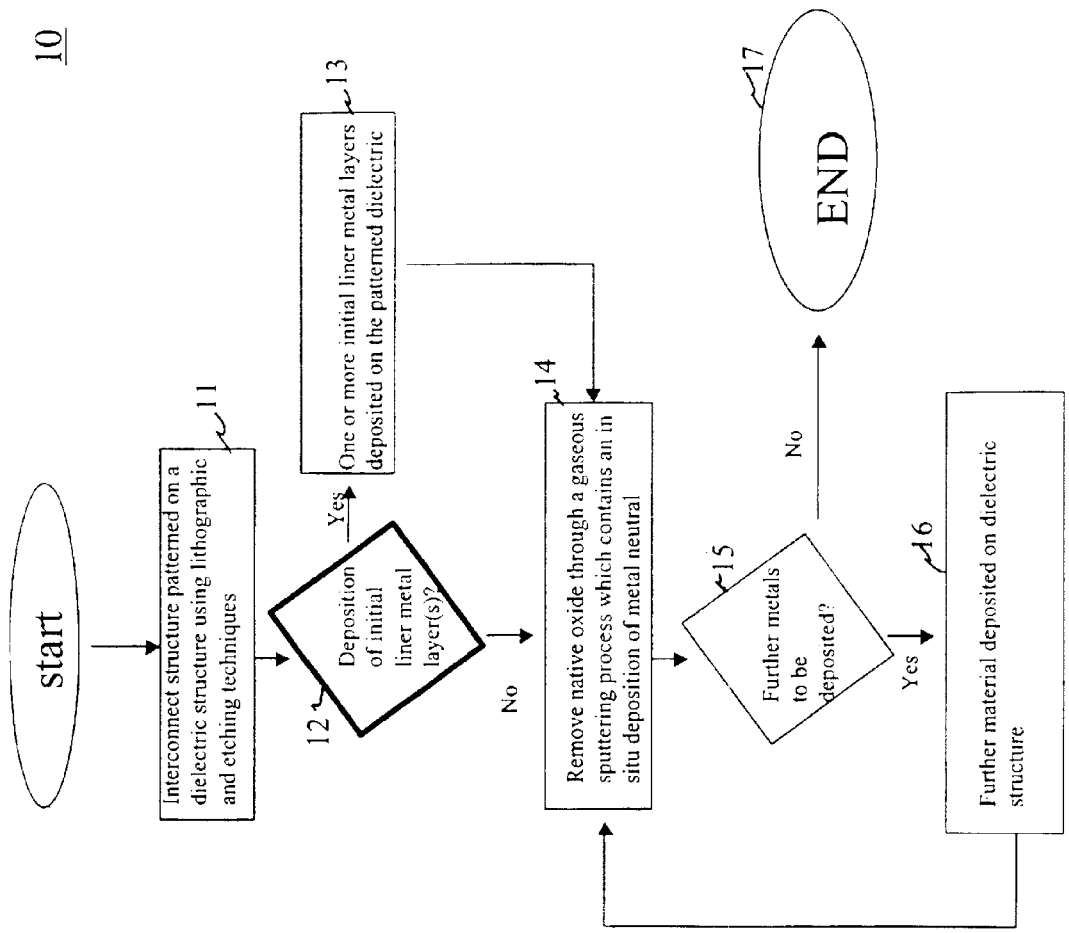
FIG. 1 is a flowchart depicting aspects of a method of semiconductor wafer fabrication according to a preferred embodiment of the present invention.
Figure 2:
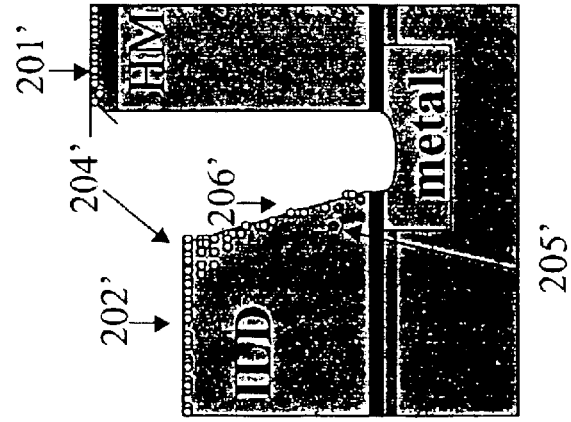
FIG. 2 is a profile view schematic illustrating exemplary prior art limitations in performing Ar sputtering on a dielectric layer of a semiconductor wafer.
Figure 2:
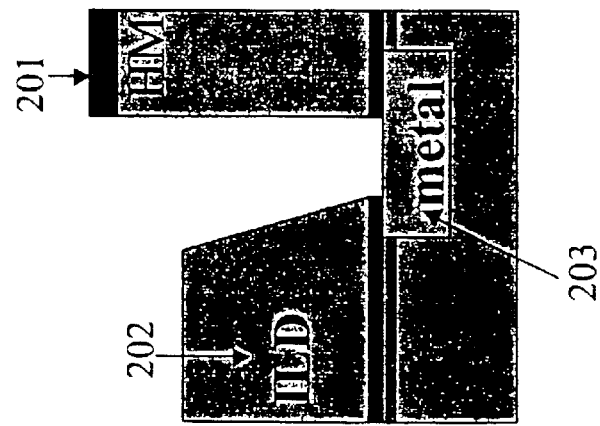

As depicted in the flowchart 10 of FIG. 1, the process begins with a semiconductor device (wafer), not shown, having a dielectric structure on which an interconnect structure is optionally patterned using lithographic and etching techniques 11. Such lithographic and etching techniques are known in the art. This wafer is placed into the deposition chamber (not shown).

Next, it is determined whether initial metal layer(s) is to be deposited 12. If there is no initial metal layer required, the wafer may stay in the deposition chamber without any process. Otherwise, one or more initial metal layers are deposited on the dielectric structure 13. The liner material is preferably TaN, Ta, Ti, TiN or W, although other material may be used.

Then, without moving the wafer to a sputtering chamber, native oxide is removed using an in situ gaseous sputtering with metal neutral deposition 14.

After removing the native oxide, it is preferably determined whether additional materials are to be deposited 15. If no additional materials are to be deposited, the process terminates 17, and the wafer may be removed.

Otherwise, further material may be deposited on the wafer 16. These materials may preferably include liner or seed layer materials, such TaN, Ta, Ti, Ti(Si)N, W, Cu, or any other suitable materials.

The steps of determining whether additional materials are to be deposited 15 and depositing further material 16 are preferably repeated without removing the wafer from the deposition chamber until no additional materials are to be deposited. Although the wafer may require additional processing outside the deposition chamber after the gaseous sputtering and metal neutral deposition steps, it is preferable and advantageous to perform as many operations as possible within the deposition chamber.

Figure 4:
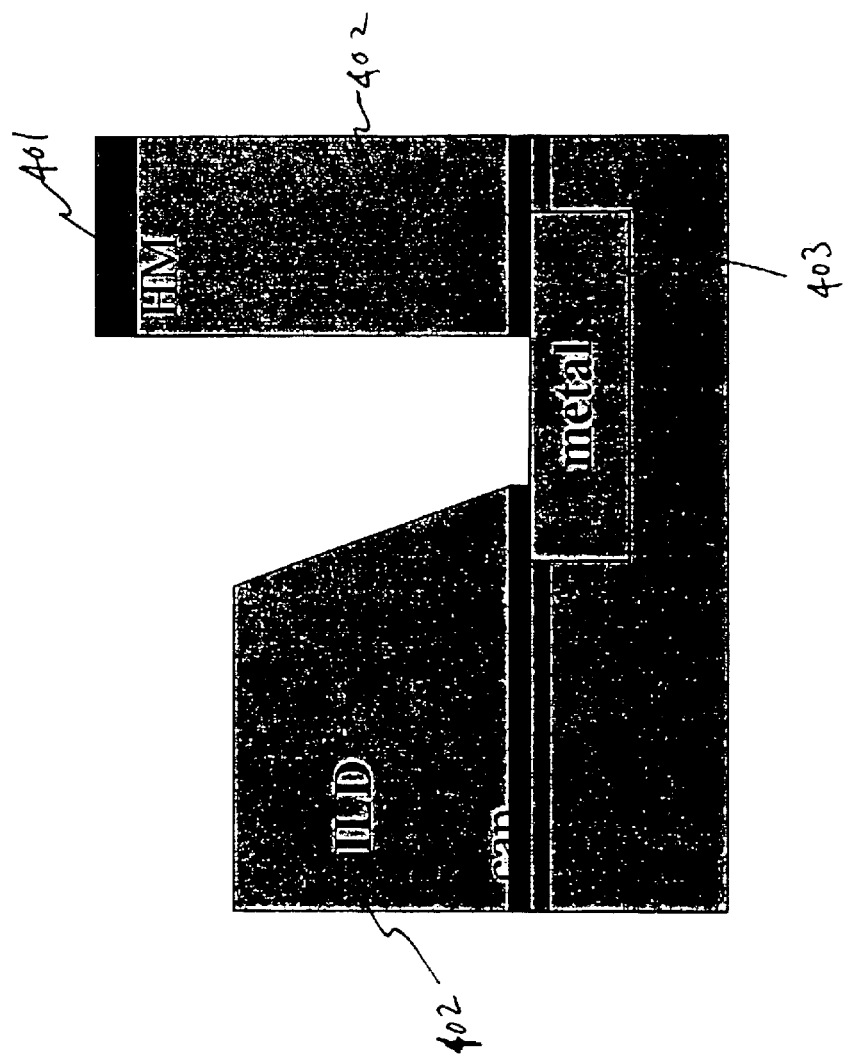
FIG. 4 is a profile block diagram of an exemplary wafer used in a process in accordance with the present invention.

FIG. 4 depicts a profile of an exemplary wafer used in a process in accordance with the present invention. An interconnect structure is patterned on a dielectric structure using lithographic and etching techniques. The interconnect structure may consist of lines (trench structures), via structures, as well as other structures (paths) as is known in the art.

Figure 5:
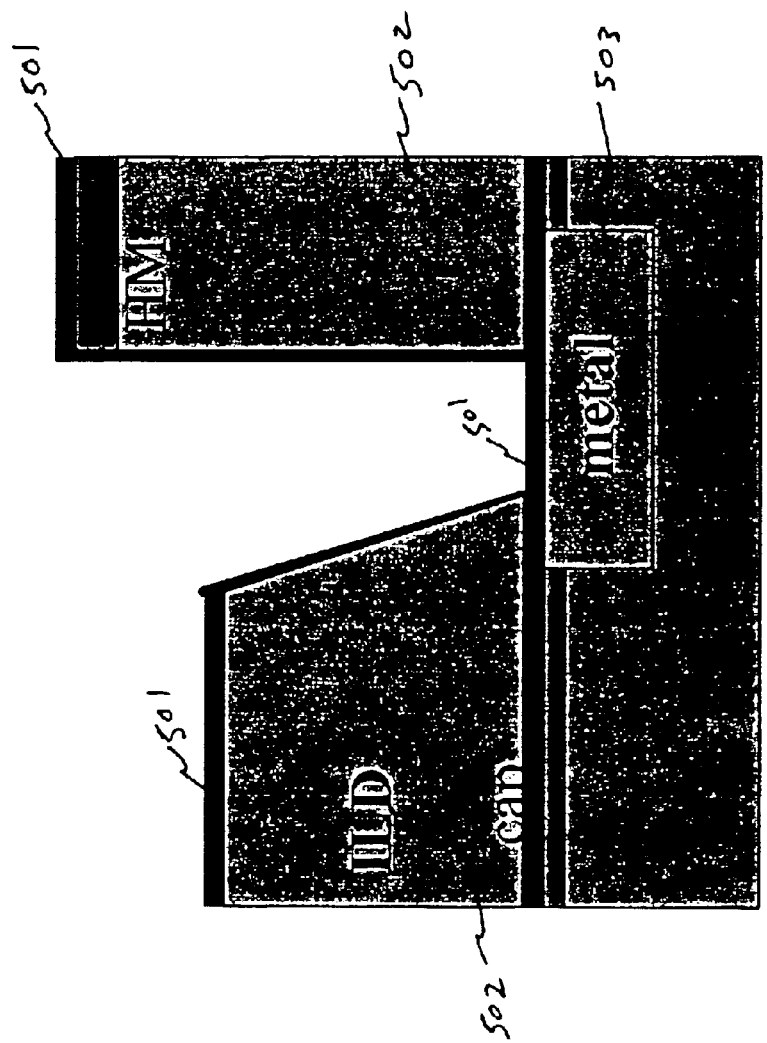
FIG. 5 is a profile block diagram of an exemplary wafer in a process in accordance with the present invention after the initial liner metal layer is deposited.

An example of the result after deposition of initial metal layer(s) is depicted in FIG. 5. A first step in the process sequence may be the degassing of the dielectric structure ("wafer"). An initial liner metal layer 501 or series of layers may be deposited on the patterned dielectric.

The layer 501 or layers may typically and preferably consist of TaN, Ta, Ti, TiN, W, or other suitable materials.

The thickness of these layers may preferably be anywhere from 10 to 500 Angstroms, depending on the needs of the particular structure and technology.

Following this initial metal film deposition, the wafer preferably and advantageously remains in the same deposition chamber and starts the directional gaseous bombardment with deposition of metal neutral simultaneously. The result of this step is depicted in FIG. 6.

Because field, trench bottom, and tapered sidewall have higher metal neutral deposition rates than the via bottom, a negative etching rate can be achieved at these areas while a positive etching rate is maintained at via bottom 601. Thus, the gaseous sputtering removes the native oxide on the underneath metal surface without damaging the other areas, i.e. field, trench bottom, and tapered sidewall.

Figure 7:
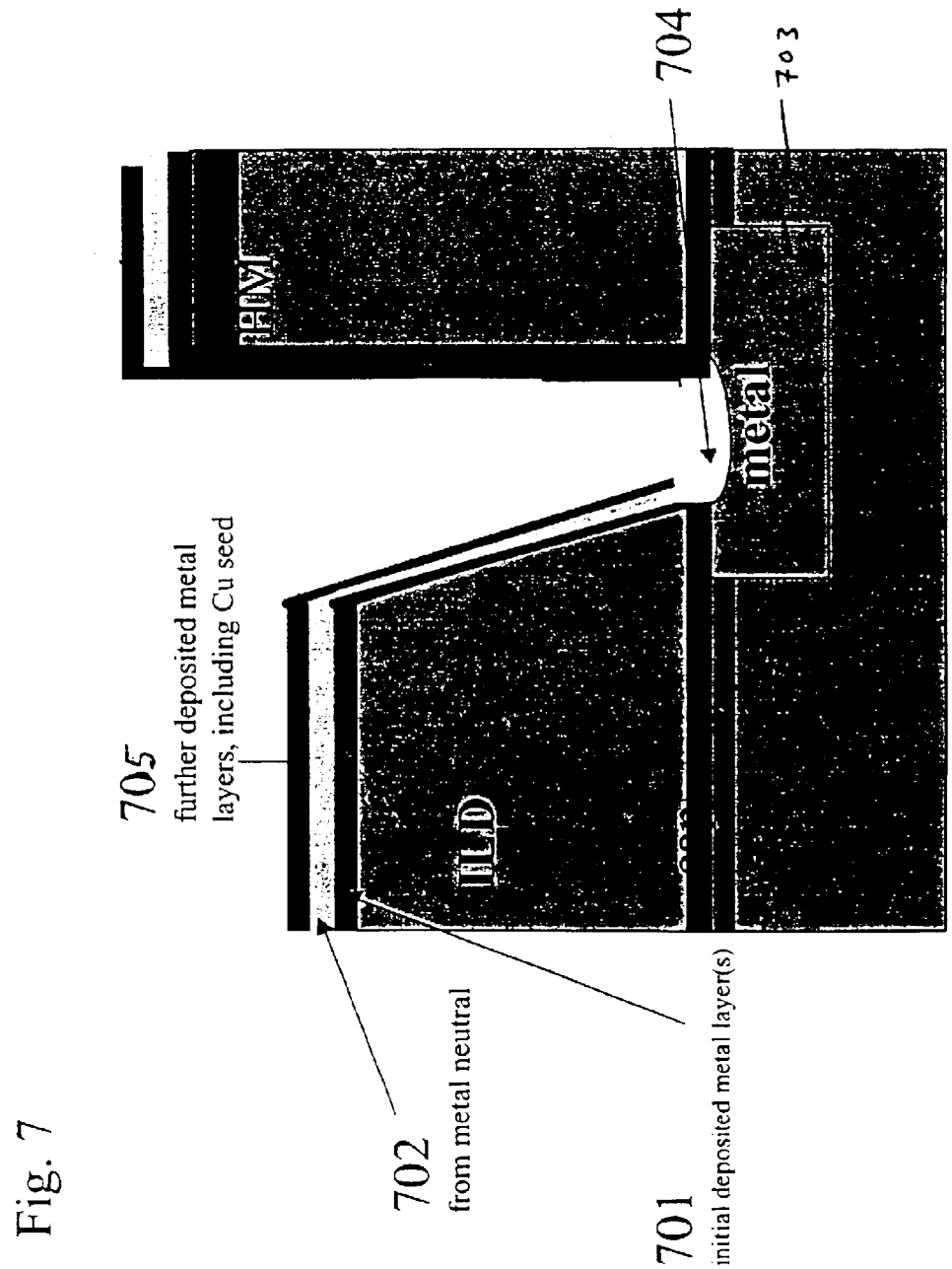
FIG. 7 is a profile block diagram of an exemplary wafer in a process in accordance the present invention after further liner or seed layer materials are deposited.

Following the gaseous sputtering on the patterned wafer, further liner or seedlayer materials 705 may be deposited, which may include TaN, Ta, Ti, TiN, W, Cu, or other suitable materials. This is depicted in FIG. 7.

Figure 6:
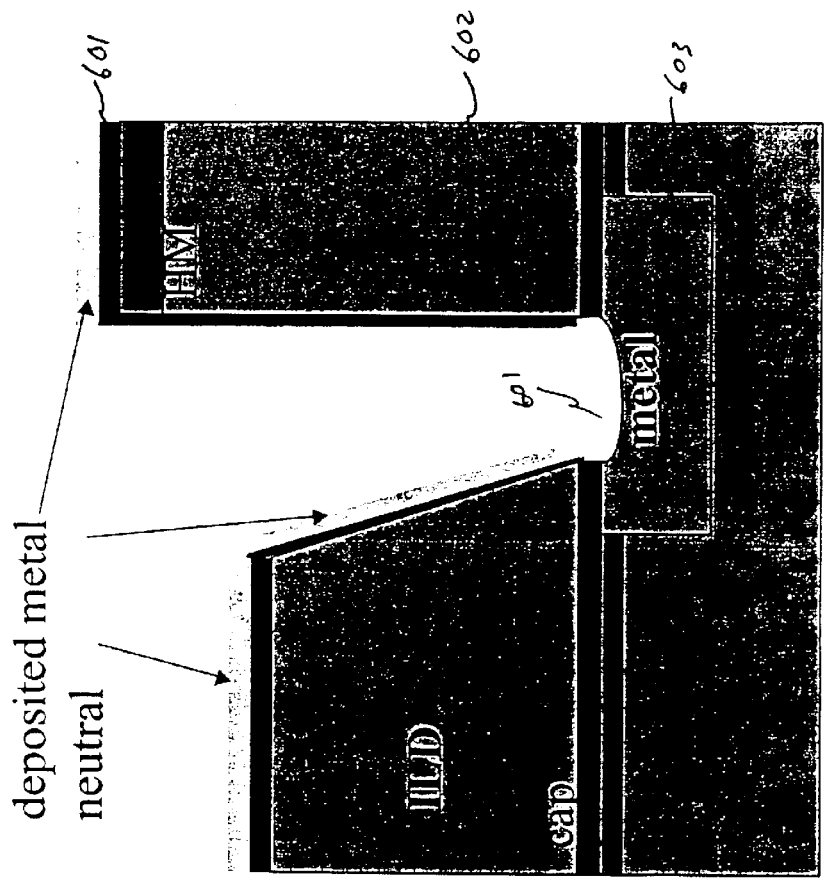
FIG. 6 is a profile block diagram of an exemplary wafer in a process in accordance the present invention after in situ gaseous sputtering with a metal neutral.

As with the description of FIG. 6, a positive etching rate may be achieved at via bottom 704 while depositing the second material (metal neutral) 702 on top of the first metal 701 at other areas, i.e. field, trench bottom, and tapered sidewall. Advantageously, this process minimizes damage to the first metal layer 701 and underneath IDL, which results in smoother and better metal coverage around the tapered via.

FIG. 8(a) is an actual I–V ramping test result depicting the performance of two exemplary wafers produced using prior art methodology (left) and the embodiment of the present invention (right) respectively. FIG. 8(b) is an actual time-dependent dielectric breakdown ("TDDB") test results depicting the performance of two exemplary wafers produced using prior art methodology (left) and the embodiment of the present invention (right) respectively. TDDB test results indicate deterioration or breakdown of the dielectric over time. FIGS. 8(a) and 8(b) exemplify a better resistance of dielectric breakdown behavior for a wafer produced by an embodiment of the present invention.

Figure 3:
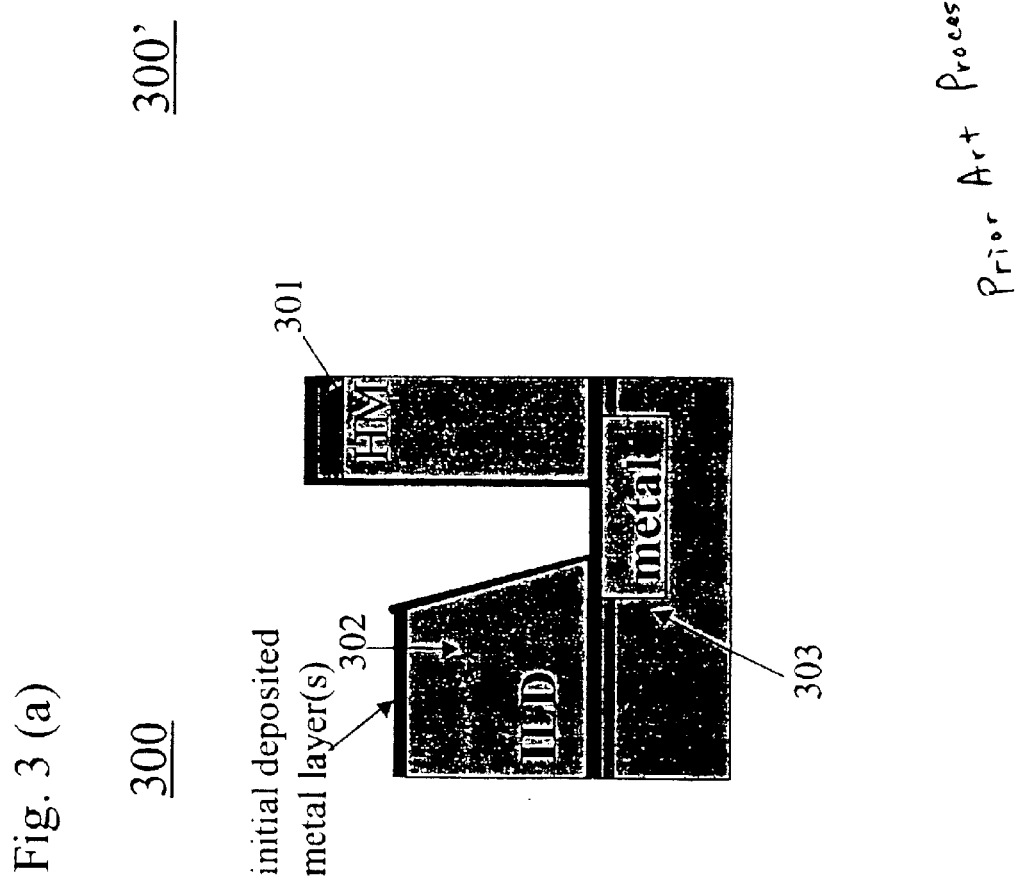
FIG. 3(a) is a profile view schematic illustrating exemplary prior art limitations in performing Ar sputtering on a metal layer of a semiconductor wafer.
FIG. 3(b) is a sample profile micrograph illustrating sidewall, hard mask and etching profile features of wafers prepared using both a prior art process and an exemplary embodiment of the present invention.
FIG. 3(c) is a sample profile micrograph illustrating sidewall, hard mask and etching profile features of a wafer prepared using a prior art process.
Figure 3:
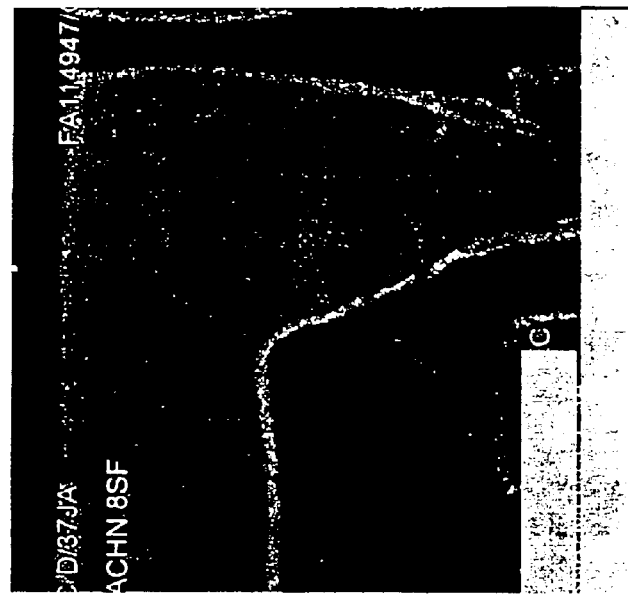
Figure 3:
Figure 3:
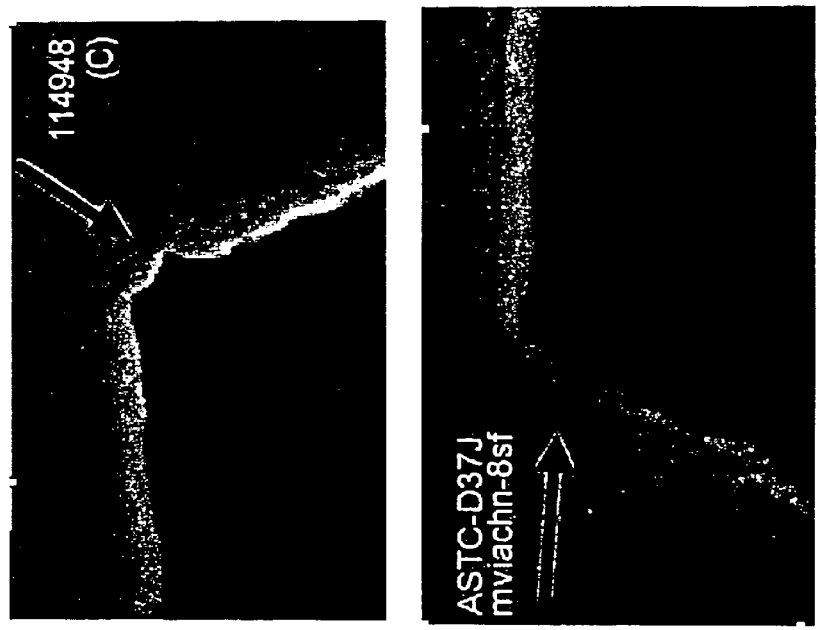
Figure 3:
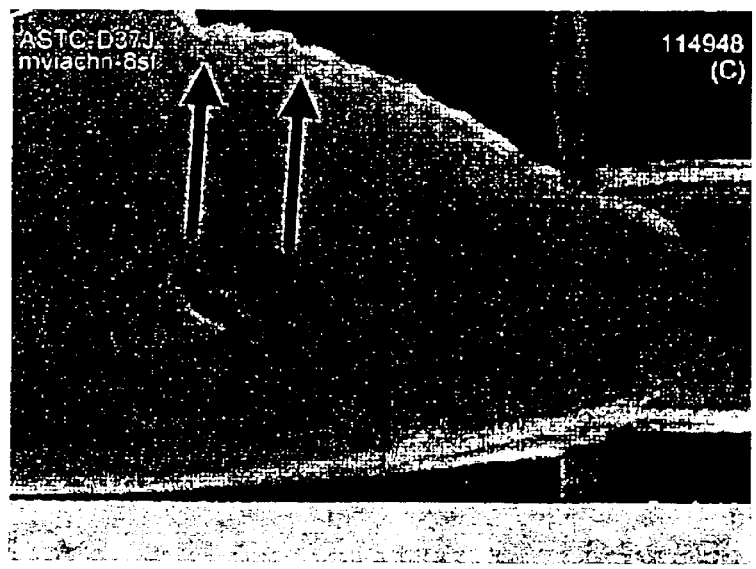

FIG. 3(b) is a sample profile micrograph illustrating sidewall, hard mask and etching profile features of a wafer prepared using a prior art process (left) and exemplary embodiment of the present invention (right). The tapered sidewall of the wafer prepared using the prior art process (left, arrow) shows significant damage. The tapered sidewall of the wafer prepared in accordance with an embodiment of the present invention (right, arrow), however, shows much less damage and is smoother in appearance.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A method of fabricating a semiconductor device within a single deposition chamber, the semiconductor device having a dielectric structure, the method of fabrication comprising:

(a) patterning the dielectric structure to form an opening that exposes a surface of an underneath metal conductor; and (b) simultaneously removing native oxide from the surface of the underneath metal conductor and depositing metal neutral through a sputter etching process.

2. The method of claim 1 wherein the sputter etching process removes the native oxide using a gas selected from the group consisting of Ar, He, Ne, Xe, $N_2$, $H_2$, $NH_3$, and $N_2H_2$.

3. The method according to claim 1, further comprising depositing one or more further materials after depositing the metal neutral.

4. The method according to claim 3, wherein the one or more further materials includes liner materials.

5. The method according to claim 3, wherein the one or more further materials includes seed layer materials.

6. The method according to claim 3, wherein the one or more further materials includes any one or more materials selected from the group consisting of TaN, Ta, Ti, Ti(Si)N, W and Cu.

7. The method of claim 1, wherein the sputter etching process proceeds to a depth substantially equal to a top surface of the underneath metal conductor.

8. The method of claim 1, wherein the opening is a via or a trench.

9. The method of claim 1, wherein the sputter etch proceeds to a depth deeper than the top surface of the underneath metal conductor.

10. The method of claim 1, further comprising depositing one or more initial metal layers on the patterned dielectric structure prior to the step (b) of simultaneously removing the native oxide and depositing the metal neutral.

11. The method according to claim 10, wherein the one or more initial metal layers deposited on the dielectric structure includes any one or more materials selected from the group consisting of TaN, Ta, Ti, Ti(Si)N and W.

12. The method according to claim 10, wherein the thickness of the one or more initial metal layers deposited on the dielectric structure is in the range 10 Angstroms to 500 Angstroms.

13. The method of claim 10, further comprising the step of depositing copper to fill the opening after depositing the metal neutral.

14. A method of metal neutral deposition on a target, comprising depositing, in situ, metal neutral onto a first surface of the target while simultaneously conducting directional gaseous bombardment for removing native oxide on a surface of a metal conductor exposed below the first surface in an opening of the target.

15. The method according to claim 14, wherein a first material is exposed at the first surface of the target, wherein the metal neutral includes one or more materials of the group consisting of the first material, Ta, Ti, and W.

16. The method of claim 14, wherein the metal conductor consists essentially of a metal selected from the group consisting of copper, tungsten and aluminum.

* * * * *